United States Patent [19]

Markman et al.

[11] 4,014,713
[45] Mar. 29, 1977

[54] THERMOELECTRIC GENERATOR

[76] Inventors: Mikhail Abramovich Markman, ulitsa Shirokaya, 1, korpus 2, kv. 264; Leonid Mikhailovich Simanovsky, ulitsa 3 Mytischinskaya, 14, kv. 18; Nikolai Vasilievich Kolomoets, Kastanaevskaya ulitsa, 61, korpus 1, kv. 22, all of Moscow; Vyacheslav Tikhonovich Kamensky, Sovetsky prospekt, 26, kv. 112, Ivanteevka Moskovskoi oblasti; Igor Mikhailovich Matskov, ulitsa Festivalnaya, 22, korpus 3, kv. 263, Moscow; Valentin Prokofievich Protsenko, ulitsa Arbat, 30, kv. 72, Moscow; Boleslav Viktorovich Sporyshev, Festivalnaya ulitsa, 53, korpus 6, kv. 617, Moscow; Valentina Sergeevna Baby, ulitsa Junykh Lenintsev, 75, korpus 3, kv. 28, Moscow, all of U.S.S.R.

[22] Filed: Aug. 15, 1975

[21] Appl. No.: 605,203

[52] U.S. Cl. .............................. 136/210; 310/4 R; 310/64

[51] Int. Cl.² ........................................ H01V 1/30
[58] Field of Search ............... 310/4, 64, 65, 54; 136/210

[56] References Cited
UNITED STATES PATENTS

| 3,054,840 | 9/1962 | Alsing | 136/210 X |
| 3,906,261 | 9/1975 | Ogura et al. | 310/54 X |

Primary Examiner—Donovan F. Duggan

[57] ABSTRACT

A thermoelectric generator comprising a thermoelectric module, means for burning fuel and supplying heat to the module, a cooling system including a hollow radiator filled with cooling liquid and a cooling jacket embracing the module and connected to the radiator by inlet and an outlet pipes, the jacket being inclined towards the inlet pipe, and the outlet pipe having at least one ascending portion, whereby a pressure differential is established that is required for the liquid circulation in the cooling system.

4 Claims, 1 Drawing Figure

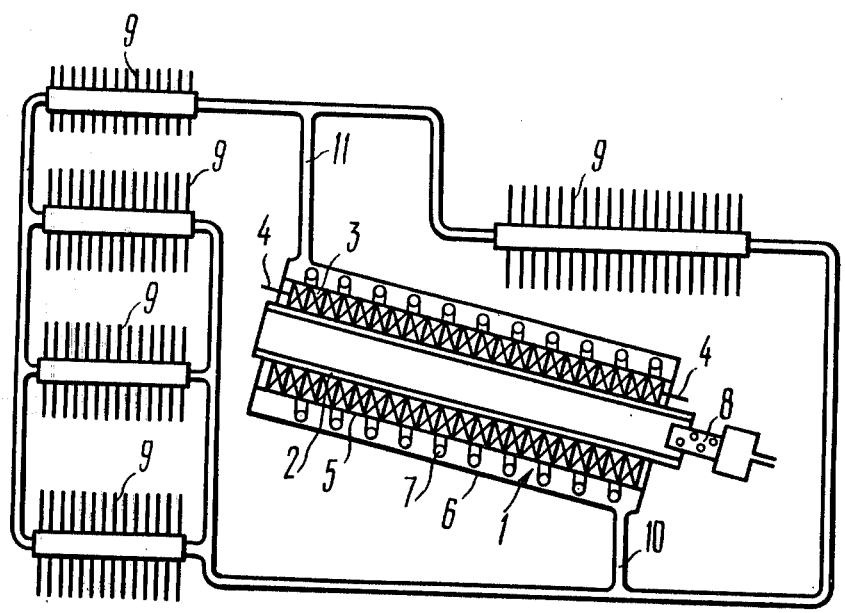

THERMOELECTRIC GENERATOR

The present invention relates to direct conversion of heat energy into electrical energy, and more specifically to thermoelectric generators. Such generators have found extensive use as independent electric power sources having a long service life and requiring no servicing. They include a thermoelectric module, means for burning organic fuel and supplying heat to the thermoelectric module, and cooling radiators. It is common to make the radiators in the form of heavy and bulky copper or aluminium plates having their ends mechanically pressed or brazed to the cold junctions of the thermoelectric module thermobatteries. The thermoelectric battery's restricted surface does not lend itself to adequate development of the cooling radiator surfaces in order to reduce their temperature and thus to improve the efficiency and power output of the thermoelectric generators.

Besides, the utilization of heat radiated by the cooling radiators for heating objects which are situated at some distance from the thermoelectric generator cannot be readily effected, and expensive non-ferrous metals are used in the radiators themselves.

Also known in the art are air-cooled thermoelectric generators comprising a thermoelectric module, means for burning fuel and supplying heat to the thermoelectric module and a cooling system including a hollow radiator filled with cooling liquid. In these prior-art generators the hollow radiators are made in the form of hollow plates having their ends pressed to the thermoelectric module composed of a number of thermoelectric batteries. The heat transfer from the thermoelectric batteries towards the hollow radiator side surfaces is ensured by the convective or laminar motion of a cooling liquid within the interior of each of the radiators under the action of gravitation forces and temperature gradients. In order to enhance the convective currents use is made of a coolant-free cavity formed by the hollow radiator side walls connected together in the central portion of each of the hollow radiators.

The foregoing prior-art construction has a number of significant disadvantages:

a. considerable losses of the thermal head occur in the boundary layer between the cooling liquid and the thermoelectric battery cold junctions due to the low heat-transfer coefficient in the case of the free convective motion of the liquid, thus causing a significant reduction of the generator efficiency;

b. the hollow radiators are constructively integrated with the thermoelectric module, and therefore the utilization of the waste heat for heating various objects, spatially distant from the generator, such as containers or packs with radio and electronic equipment, dwellings, etc., cannot be readily effected and the attendance of the means for burning fuel and supplying the heat to the thermoelectric module, the replacement of the thermoelectric modules and some other operations are difficult and inconvenient when performed under service or field conditions.

It is an object of the present invention to improve the efficiency and power output of thermoelectric generators by reducing the losses of the thermal head between the thermoelectric battery cold junctions and the cooling liquid, and ensure an easy start and better service conditions for the generator and utilization of the waste heat for heating distant objects.

This object is attained in a thermoelectric generator comprising a thermoelectric module, means for burning fuel and supplying heat to the thermoelectric module, and a cooling system including a hollow radiator filled with cooling liquid. The cooling system further includes a cooling jacket enveloping the thermoelectric module and being connected with the hollow radiator by inlet and outlet pipes, the cooling jacket being inclined towards the inlet connecting pipe, and the outlet connecting pipe having at least an ascending portion, whereby a pressure differential, required for the liquid circulation, is established in the cooling system.

Preferably, the cooling jacket is constructed so that the hydraulic resistance thereof is higher than that of the hollow radiator and the inlet and outlet connecting pipes taken together.

It is also preferable to choose the height of the outlet connecting pipe ascending portion in accordance with the following formula:

$$\frac{H}{L} > \frac{0.316\, Re^{1.75} \eta^2}{2D^3 \cdot \rho^2 \cdot m \cdot g}$$

where H is the height of the ascending portion,
$\rho$ is the density of the cooling liquid,
$\eta$ is the viscosity of the cooling liquid,
L is the equivalent length of the cooling jacket,
g is the gravitational acceleration,
D is the hydraulic diameter of the cooling jacket,
Re is the Reynolds number (Re = 2,500 to 6,000),
m is the maximum relative volume vapour content of the liquid in the outlet pipe ($m = 0.1$ to $0.5$).

It is also preferable to arrange a means for turbulizing the cooling liquid flow within the cooling jacket. This turbulizing means can be advantageously made in the form of a wire coil.

The technical solution proposed herein provides for a structural and spatial separation of the thermoelectric converter from the cooling radiator which is the bulkiest part of the thermoelectric generator, which signifies a new approach to the construction of such generators. The present invention improves the efficiency and power output of the generators and reduces production costs due to the use of standard large-surface radiators; it also makes an extra amount of electric energy available when some part of the heat produced is used for heating, e.g. living accomodations.

The present invention will now be described in greater detail with reference to the accompanying drawing, the sole FIGURE of which shows the thermoelectric generator according to the invention.

The thermoelectric generator comprises a thermoelectric module 1 including a hot heat conductor 2 enveloped by thermoelectric batteries 3 having electric leads 4 and sealed in an enclosure 5. The module 1 has a cooling jacket 6 enveloping the enclosure 5 and a turbulizing means 7 in the form of a wire coil arranged in a gap between the enclosure 5 and the cooling jacket 6. The turbulizing means 7 may also be made in the form of a plate coil or spiral. The generator includes means 8 for burning fuel and supplying heat to the thermoelectric module 1.

Hollow radiators 9 are connected to the bottom of the cooling jacket 6 by an inlet connecting pipe 10 and to the top of the cooling jacket 6 by an outlet connecting pipe 11 having at least an ascending portion in combination to form a cooling system filled with cooling liquid.

This cooling system is provided with an expansion (not shown) tank which is either sealed or opened into the atmosphere. The hollow radiators 9 have valves (not shown) mounted thereon which permit their selective use in a desired manner. An electrical load (not shown) is connected to the electric leads 4. The means 8 for burning fuel and supplying heat to the thermoelectric module 1 is connected to a cylinder (not shown) containing the fuel.

The pressure differential $\Delta p_1$ required for the circulation of the cooling liquid in the cooling system is determined by the liquid-vapour mixture in the ascending portion of the outlet pipe 11 in accordance with the following formula:

$$\Delta p_1 = \rho \cdot g \cdot H \cdot m. \quad (1)$$

The pressure differential $\Delta p_2$ at the cooling jacket 6 in this case will be:

$$\Delta p_2 = \frac{0.316 \, Re^{1.75} \cdot \eta^2 \cdot L}{2D^3 \cdot \rho}. \quad (2)$$

The turbulent flow of the cooling liquid in the cooling jacket 6 will take place at the Reynolds number:

$$Re \approx \frac{\rho \cdot V \cdot D}{\eta} > 2 \cdot 3 \cdot 10^3. \quad (3)$$

In order to obtain stable operation of the cooling system the following condition should be met:

$$\Delta p_1 > \Delta p_2. \quad (4)$$

It is assumed here that the hydraulic resistance of the cooling jacket 6 is significantly higher than that of the rest of the cooling system and that the magnitude of the volumetric vapour content in the outlet connecting pipe 11 is smaller than unity.

From the above equations the stable operating condition may be derived as follows:

$$\frac{H}{L} > \frac{0.316 \, Re^{1.75} \eta^2}{2D^3 \cdot \rho^2 \cdot g \cdot m}. \quad (5)$$

The notations used in the formulae (1) through (5) are as follows:

Re is the Reynolds number (Re = 2,500 to 6,000),
$H$ is the height of the outlet connecting pipe 11,
$L, D$ are the equivalent length and the hydraulic diameter of the cooling jacket 6, respectively,
$V$ is the flow velocity of the cooling liquid in the cooling jacket 6,
$\eta$ is the viscosity of the cooling liquid,
$m$ is the maximum relative volume vapour content in the outlet connecting pipe 11 ($m = 0.1$ to $0.5$),
$g$ is the acceleration of gravity.

The operation of the air-cooled thermoelectric generator is as follows: Fuel is fed into the means 8 for burning fuel and supplying heat to the thermoelectric module 1, and the hot heat conductor 2 is heated by the flame tongue radiation and hot gases. The heat flux flows through the thermoelectric batteries 3, thereby creating a temperature gradient therein and heats the cooling liquid in the cooling jacket 6 thus reducing the density thereof. Due to the difference of the liquid density in the cooling jacket 6 and the hollow radiators the cooling liquid starts a slow circulation. The arrangement of the module 1 in an inclined relationship to the inlet connecting pipe 10 facilitates the initiation of this circulation. As the cooling liquid flows along the cooling jacket 6, the liquid is heated to its boiling point, and a liquid-vapour mixture is produced at the top of the cooling jacket 6. This mixture is fed into the outlet connecting pipe 11 so that a liquid-vapour mixture zone is obtained in this pipe, the mixture density being significantly lower than that of the cooling liquid in the hollow radiators 9.

During steady operation the cooling liquid circulation velocity is such that the cooling liquid in the cooling jacket 6 is heated from the temperature at the inlet of the cooling jacket to the liquid boiling point, and a liquid-vapour mixture column is maintained within the outlet connecting pipe 11, this column providing for the pressure differential required for the circulation described above. In fact, the circulation velocity may fluctuate around the mean value, but these fluctuations do not actually affect the air-cooled thermoelectric generator operation.

The height of the outlet connecting pipe 11 and the hydraulic resistance of the cooling jacket 6 are selected so that the cooling liquid flowing in the cooling jacket 6 is of a turbulent nature, thus ensuring small losses of the thermal head therein. The cooling liquid flow is laminar in the rest of the cooling system (in the radiators 9 and the pipes 10 and 11) since the hydraulic resistance thereof is substantially lower than that of the cooling jacket 6.

The mean temperature of the cooling liquid in the cooling jacket 6 equals the mean temperature of this liquid in the hollow radiators 9.

On leaving the ascending portion of the outlet connecting pipe 11 the liquid-vapour mixture enters the horizontal portion of this pipe and the hollow radiators 9 where the vapour is condensed. In order to improve the operating conditions, the ascending portion of the outlet connecting pipe 11 may be equipped with some thermal insulation, or the horizontal portion may be ribbed.

Under the action of the temperature gradient an electromotive force is generated in the thermoelectric batteries 3, and the electric current flows through the electrical load (not shown) which is connected to the electric leads 4. The use of the valves (not shown) in the cooling system permits the selection of either the hollow radiators 9 installed in the space to be heated (in cold seasons) or those installed in the open (in warm seasons or with the aim of increasing the electric energy production).

What is claimed is:

1. A thermo-electric generator comprising: a tubular thermo-electric module formed by a tubular inner heat conductor, a tubular thermo-electric battery enclosing said heat conductor, and an outer heat conductor enclosing said battery; means for burning fuel and applying heat to said inner heat conductor; a cooling system including a hollow radiator in heat-transfer contact with the ambient air, a cooling jacket enclosing said outer heat conductor and forming therewith an annular channel for the flow of a cooling liquid, and inlet and outlet pipes to connect said jacket with said radiator; said cooling system being filled completely with the cooling liquid; said jacket being arranged at an angle to said inlet pipe; and said outlet pipe having an ascending portion.

2. The generator as defined in claim 1, wherein said annular channel has an equivalent diameter for the flow of the cooling liquid that is equal to one-fifth to one-tenth of any of the equivalent diameters of said pipes and the space of said radiator.

3. The generator as defined in claim 1, further comprising means for turbulizing the flow of the cooling liquid in said jacket.

4. The generator as defined in claim 3, wherein said turbulizing means is made in the form of a wire coil.

* * * * *